United States Patent [19]

Masuda et al.

[11] Patent Number: 4,821,014

[45] Date of Patent: Apr. 11, 1989

[54] VARIABLE RESISTOR FOR MOUNTING ON SURFACE

[75] Inventors: Fumitoshi Masuda; Yukinori Ueda, both of Nagaokakyo, Japan

[73] Assignee: Murata Manufacturing Co., Ltd., Nagaokakyo, Japan

[21] Appl. No.: 194,232

[22] Filed: May 16, 1988

[30] Foreign Application Priority Data

May 15, 1987 [JP] Japan ................................ 62-119683

[51] Int. Cl.⁴ ............................................. H01C 10/32
[52] U.S. Cl. .................... 338/164; 338/174; 338/202
[58] Field of Search ............... 338/163, 164, 174, 184, 338/199, 171, 202

[56] References Cited

U.S. PATENT DOCUMENTS

| | | | |
|---|---|---|---|
| 3,617,978 | 11/1971 | Gerstmeier | 338/202 X |
| 4,511,879 | 4/1985 | Fujii | 338/174 |
| 4,521,761 | 6/1985 | Welch | 338/202 X |

Primary Examiner—C. L. Albritton
Attorney, Agent, or Firm—Armstrong, Nikaido, Marmelstein & Kubovcik

[57] ABSTRACT

A variable resistor whose resistance is adjustable by rotating a rotor relative to an insulating substrate defining an arcuate resistive element. The rotor is formed of an insulating resin and includes an inner skirt and an outer skirt extending from a bottom surface thereof. The inner skirt contacts a surface position of the insulating substrate inwardly of the arcuate resistive element and the outer skirt outwardly thereof. A metallic slider is integrated with the rotor by insert molding. The slider comprises a base portion formed of at least two overlapping metal plates, and arms defining contacts at distal ends thereof for slidable contact with the resistive element on the insulating substrate. The arms are folded along lines parallel to a straight line extending through the contacts at the ends thereof and the center of the insulating substrate to cause the contacts to project toward the substrate. One of the metal plates forming the base portion cooperates with inner and outer skirts of the rotor to seal a space accommodating the resistive element and the arms of the slider.

7 Claims, 7 Drawing Sheets 4,821,014

VARIABLE RESISTOR FOR MOUNTING ON SURFACE

BACKGROUND OF THE INVENTION (1) Field of the Invention

The present invention relates to variable resistors for mounting on a surface such as a printed circuit board, which have resistance adjustable by rotating a slider on a resistive element formed on an insulating substrate.

(2) Description of the Prior Art

A known example of such variable resistor is illustrated in FIGS. 1 and 2A through 2C. FIG. 1 is an exploded perspective view of the variable resistor, FIG. 2A is a plan view, FIG. 2B is a section taken on line A—A of FIG. 2A, and FIG. 2C is a bottom view of the variable resistor.

The illustrated variable resistor comprises an insulating substrate 1 defining a bore 1a substantially centrally thereof. The substrate 1 includes an arcuate resistive element 2 formed on a surface thereof concentrically with the bore 1a, and external electrodes 3 and 4 formed, for instance, by printing and baking silver paste onto the insulating substrate 1 to extend from the surface to an end face and the bottom surface, respectively. One of the electrodes 3 is electrically connected to one end of the resistive element 2 and the other electrode 4 to the other end thereof. Number 5 indicates an electrode formed of a metallic plate and including a hollow center cylinder 6 formed integrally with the electrode 5 such as by the drawing process. The electrode 5 is fixed to the bottom surface and an end face of the insulating substrate 1 with the center cylinder 6 inserted into the bore 1a of the substrate 1. Number 7 indicates a slider defining a bore 7a substantially centrally thereof, a contact 7b peripherally thereof for contacting the resistive element 2, and a U-shaped cutout 7c. Number 8 indicates a metallic rotor defining a bore 8a substantially centrally thereof, driver grooves 8b in an upper surface, and a projection 8c at one peripheral position on its bottom surface. The center cylinder 6 of the electrode 5 extends through the bores 7a and 8a of the slider 7 and rotor 8, with the projection 8c engaging the U-shaped cutout 7c of the slider 7. The slider 7 and rotor 8 are rotatably assembled with the insulating substrate 1 by calking the distal end of the cylinder 6. It will be appreciated that the slider 7 and rotor 8 are rotatable in unison by the engagement between the cutout 7c and projection 8c. According to this variable resistor, the slider 7 and rotor 8 are rotatable by fitting the tip of a driver in the driver grooves 8b. The rotation causes the contact 7b to slide on the resistive element 2, thereby to adjust the resistance between the external electrode 3 or 4 and the electrode 5.

Another known variable resistor is illustrated in FIGS. 3A and 3B. This variable resistor is contained in a case 13 and is adapted for mounting on a surface by flow soldering. In FIGS. 4A and 3B like parts of the variable resistor are labeled with like reference numerals with respect to the variable resistor shown in FIGS. 1 and 2A through 2C and will not be described again.

This variable resistor includes electrodes 9, 10 and 11 formed of metallic plates. The electrodes 9 and 10 are attached to one end face of an insulating substrate 1 and electrically connected to opposite ends of a resistive element 2, respectively. These electrodes 9 and 10 correspond to the electrodes 3 and 4 of the foregoing variable resistor, and the electrode 11 to the electrode 5 thereof. The electrode 11 is electrically connected to a center rod 12 corresponding the center cylinder 6 of the foregoing variable resistor. The slider 7 and rotor 8 are rotatably mounted on the insulating substrate 1 by calking a distal end of the center rod 12 in the bore 8a of the rotor 8. Number 13 indicates a plastic case having a top opening. The insulating substrate 1 is insert molded with the electrode 9, 10 and 11 extending outwardly of the case 13 and a surface of the substrate 1 exposed to a bottom inside surface of the case 13. The outwardly extending electrodes 9, 10 and 11 are bent over to the bottom of the case 13. Number 14 indicates a heat-resistant film covering secured peripherally of the top opening of the case 13 to seal the opening. The film covering 14 is formed of a transparent material through which the interior parts of the variable resistor may be seen as depicted in FIG. 3A.

This variable resistor is mounted on a printed circuit board or the like such as by flow soldering, and thereafter the film covering may be broken with a driver or the like. Then the slider 7 and rotor 8 are turned with the driver to cause a contact 7b to slide on a resistive element 2 for adjusting the resistance.

The above two known variable resistors have the following disadvantages.

The variable resistor shown in FIGS. 1 and 2, because the resistive element 2 and slider 7 are exposed outside, cannot be mounted on a printed circuit board or the like by flow soldering which provides high productivity. Thus, the variable resistor must depend on reflow soldering for mounting on the circuit board or the like. However, even in mounting by reflow soldering, flux tends to be scattered onto the resistive element 2 and slider 7 to cause imperfect contact.

The variable resistor shown in FIG. 3 which is contained in the case 13 can be mounted on a circuit board by flow soldering, but includes many parts and, therefore, is troublesome and costly to manufacture. Moreover, when breaking the film covering 14 with a driver or the like, fragments of the film covering 14 tend to be scattered inside and outside the case 13 thereby causing imperfect contact for the variable resistor itself or producing a detrimental effect on the device on which the variable resistor is mounted. There is a further disadvantage in that, once the film covering 14 is broken, the device on which the variable resistor is mounted becomes no longer adjustable or washable because the resistive element 2 and slider 7 are exposed to the outside.

SUMMARY OF THE INVENTION

A primary object of the present invention, therefore, is to provide an improved surface-mountable variable resistor.

Another object of the invention is to provide a variable resistor which may be mounted on a surface by flow soldering.

A further object of the invention is to provide a variable resistor in which the resistive element and slider are maintained in a sealed state after a resistance adjustment so as to allow readjustment and washing.

The above objects are fulfilled according to the present invention by a variable resistor comprising an insulating substrate including an arcuate resistive element, a rotor formed of an insulating material and rotatably mounted on the insulating substrate, the rotor having a bottom surface opposed to the insulating substrate, the bottom surface including sealing means for defining a sealed space accommodating the resistive element, and a metallic slider integrated with the rotor by insert molding, wherein the slider includes a base portion embedded in the rotor and arms extending from the base portion, the base portion being formed of at least two overlapping metal plates one of which closes an upper position of the sealed space accommodating the resistive element, the arms projecting toward the insulating substrate in the sealed space and having projecting ends thereof in contact with the resistive element.

Preferably, the sealing means comprises an inner and an outer skirts formed on the bottom surface, the skirts being in contact with the insulating substrate and cooperating with the base portion of the slider to define the sealed space accommodating the resistive element formed on the insulating substrate.

The variable resistor may further comprise elastic elements formed on the insulating substrate for contacting the skirts.

In a preferred embodiment of the invention, the arms of the slider are formed peripherally of the base portion and bent on lines parallel to a line extending through a center of the base portion and the distal ends of the arms, whereby the distal ends project to the insulating substrate. The arms comprise a pair of arcuate members extending in opposite directions from peripheral positions of the base portion, with the distal ends thereof spaced from each other radially of the slider to be free from mutual interference.

The variable resistor may further comprise an electrode extending from a bottom surface to an end face thereof and including a hollow cylinder projecting from a surface of the electrode, the hollow cylinder extending centrally of the insulating substrate and the slider with a distal end thereof calked, whereby the rotor is rotatable relative to the insulating substrate.

The insulating substrate may include, in addition to the resistive element, two electrodes connected to opposite ends of the resistive element.

Since, according to the present invention, the slider having a base portion consisting of at least two layers is insert-molded in the rotor, tight sealing is assured at the junction between the rotor and slider. This reliable sealing feature enables the variable resistor to be mounted on the surface of a device by flow soldering and to be manufactured more easily and at a lower cost than the existing variable resistors. The variable resistor according to the present invention does not involves the trouble of breaking the film covering after mounting or the problem of imperfect contact caused by scattering fragments of the broken covering. Because of the constantly sealed structure, this variable resistor has excellent environmental capabilities and allows the device on which the variable resistor is mounted to be re-adjusted and re-washed. Furthermore, the slider has the arms bent on lines parallel to the line extending through the center of the base portion and the contacts defined at the distal ends of the arms. This feature enables the slider to be insert-molded in the rotor with the contacts and arms placed in a space formed in a metal mold.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENT

Figure 1:
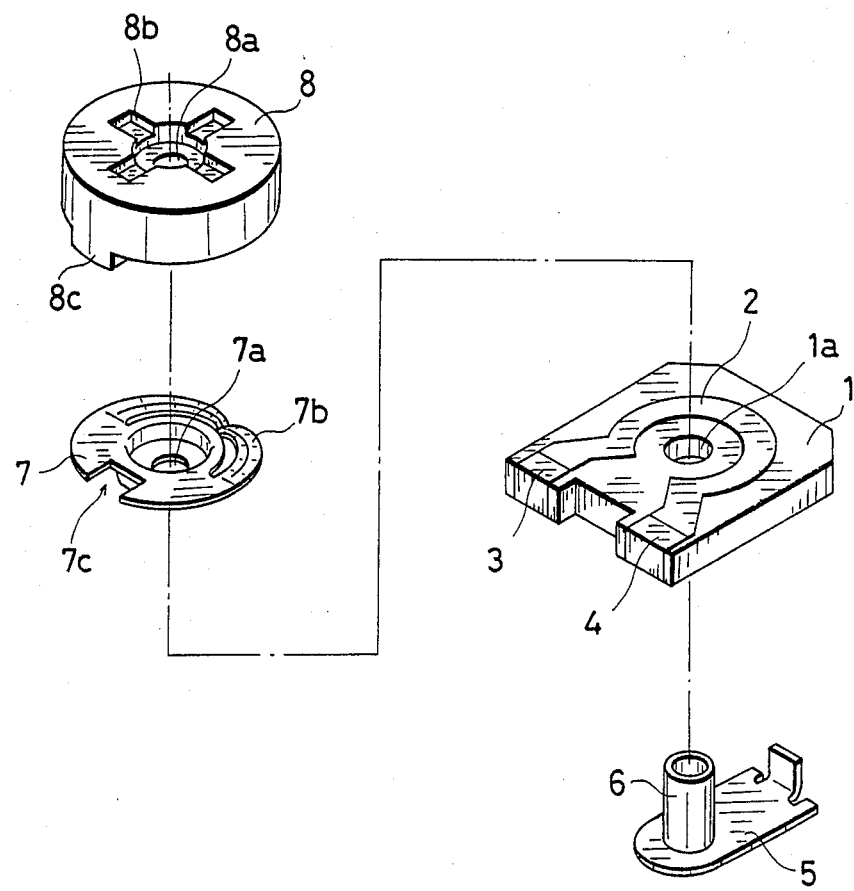
FIG. 1 is an exploded perspective view of a known variable resistor.
Figure 2A:
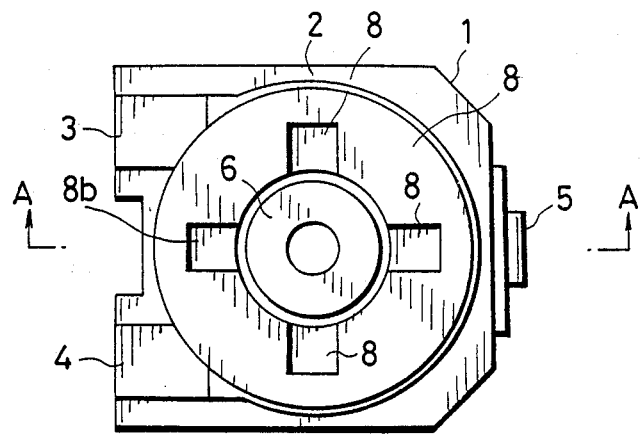
FIG. 2A is a plan view of the known variable resistor.
Figure 2B:
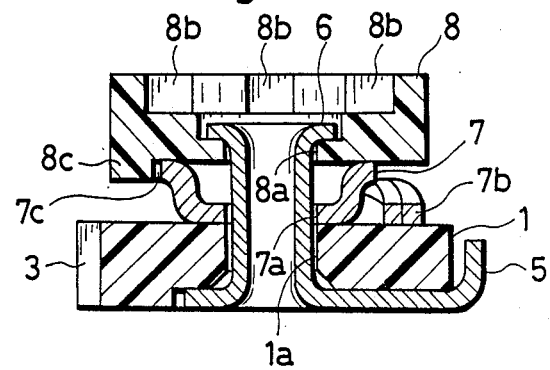
FIG. 2B is a section taken on line A—A of FIG. 2A.
Figure 2C:
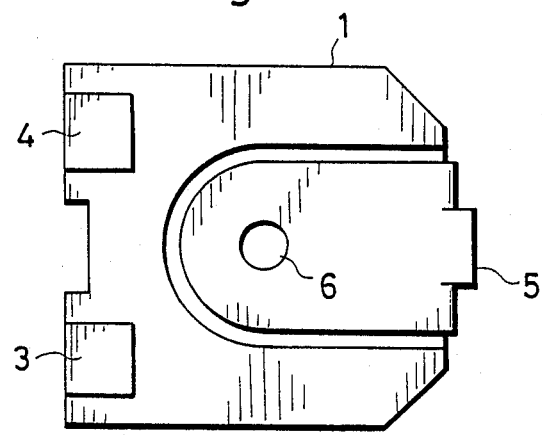
FIG. 2C is a bottom view of the known variable resistor.
Figure 3A:
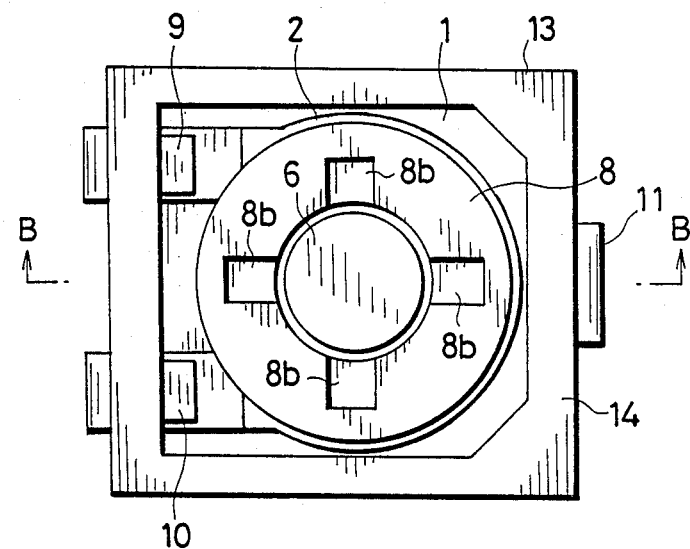
FIG. 3A is a plan view of another known variable resistor.
Figure 3B:
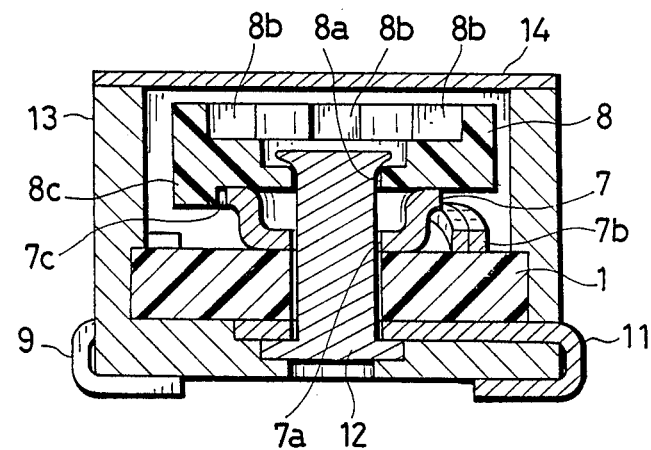
FIG. 3B is a section taken on line B—B of FIG. 3A.
Figure 4:
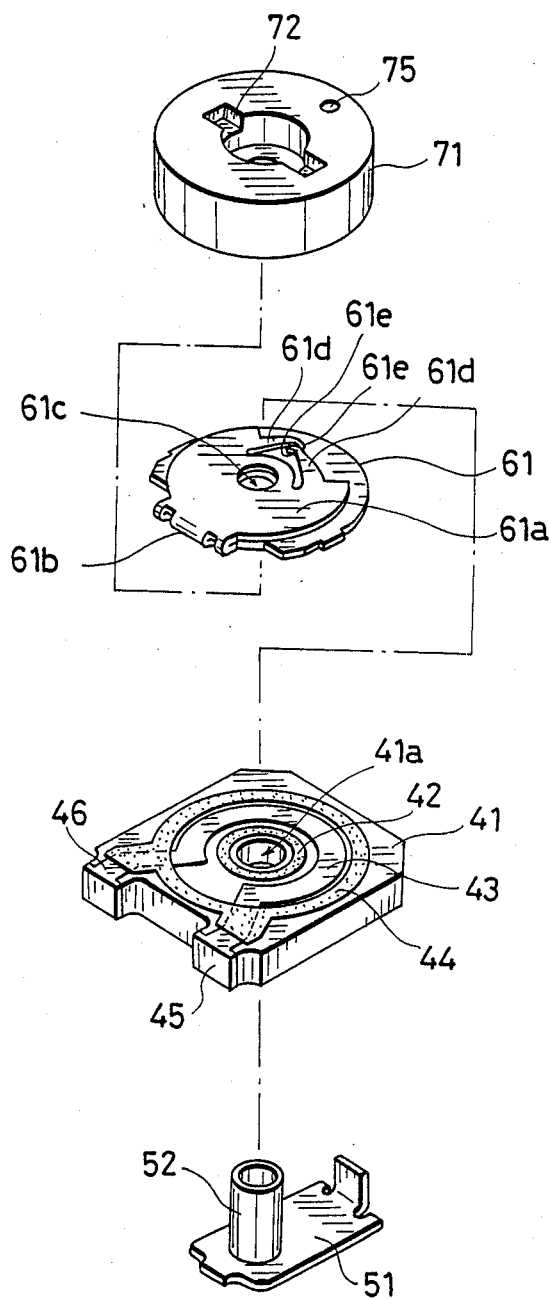
FIG. 4 is an exploded perspective view of a variable resistor according to one embodiment of the present invention.

FIG. 4 is an exploded perspective view of a variable resistor embodying the present invention. The variable resistor comprises an insulating substrate 41 defining a bore 41a substantially centrally thereof. The substrate 41 includes an inner elastic element 42, a resistive element 43 and an outer elastic element 44 formed on its surface concentrically with the bore 41a and having different diameters. The inner and outer elastic elements 42 and 44 may be formed of insulating silicone elastomer or the like which is resistant to the flow soldering temperature and the flux cleaning solvent. The elastic elements 42 and 44 may be secured to the insulating substrate 41 by screen printing, drawing, dipping or other such methods. The resistive element 43 may be formed of cermet, carbon or the like. The method of forming the resistive element 43 on the insulating substrate 41 may comprise screen-printing the above-mentioned material in the illustrated pattern to the substrate 41, which is followed by drying and baking steps.

The resistive element 43 is connected at one end thereof to an external electrode 45 and at the other end to an external electrode 46. The external electrodes 45 and 46 are formed, for instance, by printing and baking silver paste onto the insulating substrate 41 to extend from the upper surface to an end face and the bottom surface, respectively.

Number 51 indicates an electrode formed of a metallic plate and including a hollow center cylinder 52 formed integrally with the electrode 51 such as by the drawing process. The electrode 51 is fixed to the bottom surface and an end face of the insulating substrate 41 with the center cylinder 52 inserted into the bore 41a of the substrate 41 as shown in FIGS. 6A through 6D.

Figure 5A:
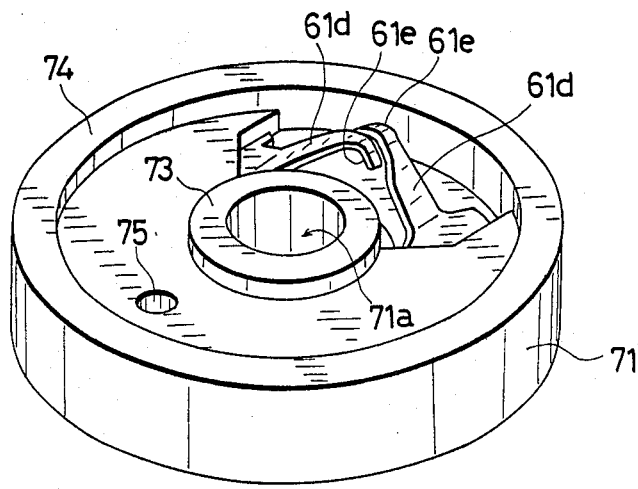
FIG. 5A is a perspective view of a rotor as seen from below.
Figure 5B:
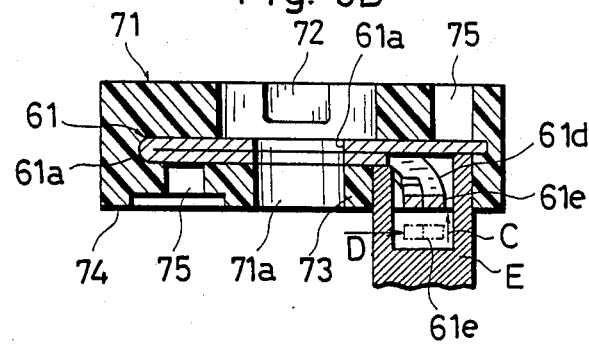
FIG. 5B is a sectional side view of the rotor.
Figure 5C:
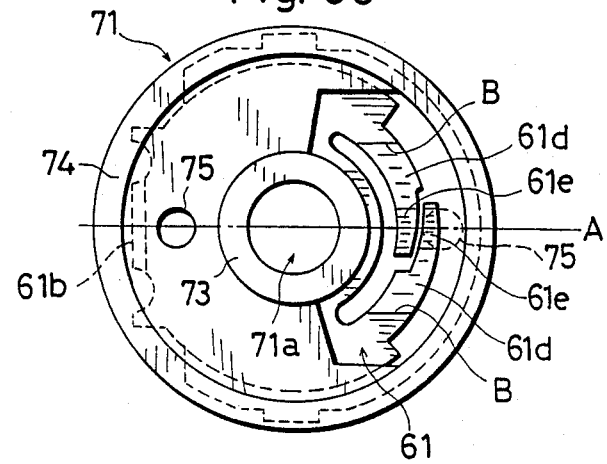
FIG. 5C is a bottom view of the rotor.

Number 61 indicates a slider formed by press-working a single conductive metal plate. The slider 61 includes a base portion 61a and a pair of arms 61d disposed peripherally thereof. The base portion 61a is folded at an end 61b to have a double layer construction, and defines a bore 61c centrally thereof. The arms 61d extend in circumferential directions and define contacts 61e at distal ends thereof, respectively. As shown in FIG. 5C, the arms 61d are bent on straight lines B parallel to a line A extending through the center of base portion 61a and the contacts 61e. As also seen from FIG. 5C, the contacts 61e are in divided arc forms and there is no interference therebetween, whereby the contacts 61e are operable freely of each other to promote contact reliability. It is to be noted that, for the purpose of illustration, FIG. 4 shows the slider 61 as inverted from the posture in which the slider 61 is actually used. Further, while the slider 61 is shown separately from a rotor 61, in practice the slider 61 is insert-molded in the rotor 61 to form an integral unit.

The rotor 71 is formed of a thermosetting resin having excellent heat resistance or a heat-resistant thermoplastic resin such as PPS resin, in which the slider 61 is insert-molded. The rotor 71 defines a bore 71 centrally thereof and driver groove 72 in a top surface. As shown in FIGS. 5A through 5C, the bottom of the rotor 71 includes an inner annular skirt 73 and an outer annular skirt 74. When the rotor 71 is assembled with the insulating substrate 41, the inner skirt 73 is in elastic contact with the inner elastic element 42 on the substrate 41 and the outer skirt 74 with the outer elastic element 44.

The order of assembling the foregoing components to form the variable resistor will be described next. The rotor 61 is first formed with the slider 61 insert-molded therein. At this time the contacts 61e of the slider 61 are in free state at positions shown in dot and dash lines in FIG. 5B. When the slider 61 and rotor 71 are mounted on the insulating substrate 41, the contacts 61e flex in the direction of arrow C to positions shown in solid lines. The contacts 61e are movable vertically in the direction of arrow C since the arms 61d are bent on the straight lines B parallel to the straight line A. If the arms 61d were bent at an angle to the straight line A, the contacts 61e in the free state would have to be displaced from the dot-and-dash-line positions in the direction of arrow D or in the opposite direction in order to move to the solid-line positions when the slider 61 and rotor 71 are mounted on the substrate 41. The rotor 71 is molded with the contacts 61e and arms 61d placed in a space defined in a metal mold E shown in FIG. 5B. Therefore, if the contacts 61e in the free state were displaced from the dot-and-dash-line positions in the direction or arrow D or in the opposite direction, the contacts 61e and arms 61d could not be placed in the space of the metal mold E. In other words, the molding of the rotor 71 is possible where, as in this embodiment, the arms 61d are bent on the straight lines B parallel to the straight line A so that the contacts 61e are vertically movable in the direction of arrow C.

The rotor 71 is shown having bores 75 which are left after pulling out pins for supporting the slider 61 during the molding operation.

Figure 6A:
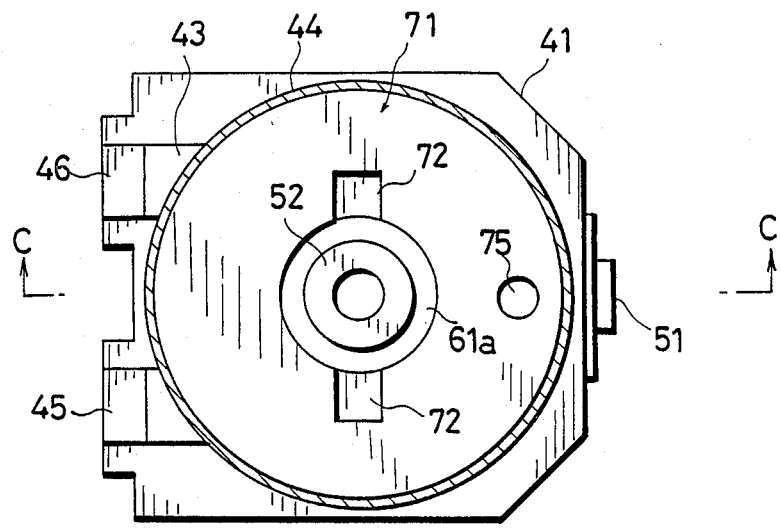
FIG. 6A is an overall plan view of the variable resistor of FIG. 4.
Figure 6B:
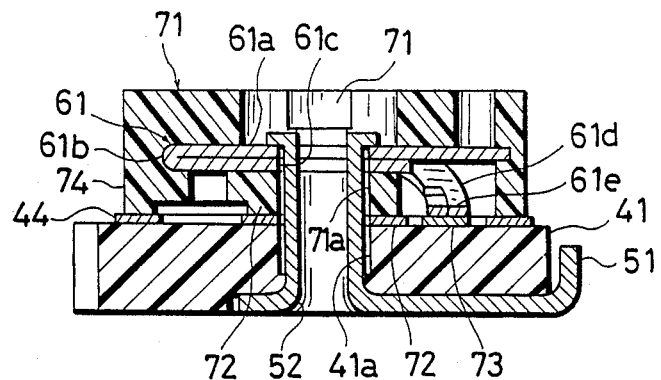
FIG. 6B is a section taken on line C—C of FIG. 6A.

The rotor 71 thus formed with the slider 61 insert-molded therein is rotatably mounted on the insulating substrate 41 as shown in FIG. 6B. As seen, the center cylinder 52 of the electrode 51 attached to the substrate 41 projects from the bore 61c of the slider 61 and has the distal end thereof calked.

Figure 6C:
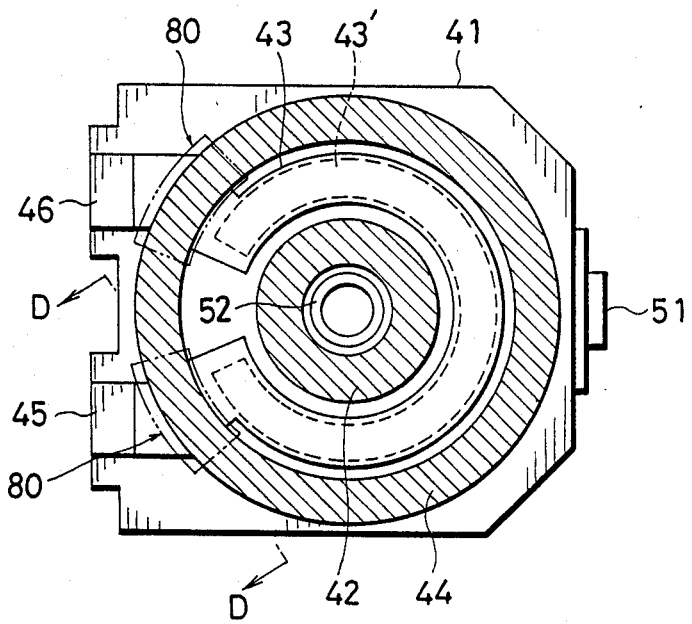
FIG. 6C is a plan view of an insulating substrate.
Figure 6D:
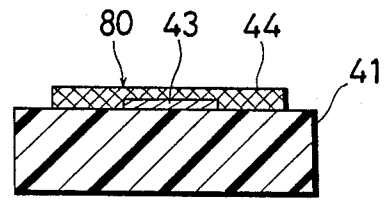
FIG. 6D is a section taken on line D—D of FIG. 6C.

In FIG. 6C, a dotted line 43' indicates a portion of the resistive element 43 over which the slider 61 is slidable, and two dot and dash lines indicate positions where the resistive element 43 and the outer skirt 74 of rotor 71 cross each other.

According to the variable resistor having the described construction, the space between the insulating sub and rotor 71 where the contacts 61e are situated is sealed tight. That is, the junction between the rotor and slider which was not sealed tight in the prior art is now provided with reliable sealing by this construction in which the slider 61 has the base portion 61a folded double and is insert-molded in the rotor 71. The tight sealing is assured by the inner and outer elastic elements 42 and 44 interposed between the inner and outer skirts 73 and 74 formed on the rotor 71 and the surface of the insulating substrate 41. Consequently, the resistive element 43 and slider 61 are sealed tight which allows the variable resistor to be mounted by flow soldering and to be cleaned with flux.

The foregoing embodiment is one example of variable resistor according to the present invention, and may of course be modified within the scope and spirit of the invention. In particular, the sealing structure between the surface of insulating substrate 41 and the rotor 71 may take various forms. For example, the inner and outer elastic elements 42 and 44 may be replaced with other types of elastic material such as O-rings. Further, the slider 61 may comprise a combination of two members welded or otherwise joined together instead of the folded structure. Further, the material for the external electrodes 45, 46 is not limited to silver paste but silver-palladium paste and the like may be employed therefor.

What is claimed is:

1. A variable resistor whose resistance is adjustable through a rotating operation, comprising
an insulating substrate including an arcuate resistive element,
a rotor formed of an insulating material and rotatably mounted on said insulating substrate, said rotor having a bottom surface opposed to said insulating substrate, said bottom surface including sealing means for defining a sealed space accommodating said resistive element, and
a metallic slider integrated with said rotor by insert molding,
wherein said slider includes a base portion embedded in said rotor and arms extending from said base portion, said base portion being formed of at least two overlapping metal plates one of which closes an upper position of said sealed space accommodating said resistive element, said arms projecting toward said insulating substrate in said sealed space and having projecting ends thereof in contact with said resistive element.

2. A variable resistor as claimed in claim 1 wherein said sealing means comprises an inner and an outer skirts formed on said bottom surface, said skirts being in contact with said insulating substrate and cooperating with said base portion of said slider to define said sealed space accommodating said resistive element formed on said insulating substrate.

3. A variable resistor as claimed in claim 2 further comprising elastic elements formed on said insulating substrate for contacting said skirts.

4. A variable resistor as claimed in claim 1 wherein said arms of said slider are formed peripherally of said base portion and bent on lines parallel to a line extending through a center of said base portion and said distal ends of said arms, whereby said distal ends project to the insulating substrate.

5. A variable resistor as claimed in claim 4 wherein said arms comprise a pair of arcuate members extending in opposite directions from peripheral positions of said base portion, with said distal ends thereof spaced from each other radially of said slider to be free from mutual interference.

6. A variable resistor as claimed in claim 1 further comprising an electrode formed of a metallic plate and including a hollow cylinder projecting from a surface of the electrode, said hollow cylinder extending centrally of said insulating substrate, said slider and said rotor with a distal end thereof calked, whereby said rotor is rotatable relative to said insulating substrate.

7. A variable resistor as claimed in claim 1 wherein said insulating substrate includes, in addition to said resistive element, two electrodes connected to opposite ends of said resistive element.

* * * * *